United States Patent [19]
Toyama et al.

[11] Patent Number: 5,398,029
[45] Date of Patent: Mar. 14, 1995

[54] SAMPLING RATE CONVERTER

[75] Inventors: Akira Toyama; Minoru Takeda, both of Tokyo, Japan

[73] Assignee: Nippon Precision Circuits Inc., Tokyo, Japan

[21] Appl. No.: 171,045

[22] Filed: Dec. 21, 1993

[30] Foreign Application Priority Data

Dec. 21, 1992 [JP] Japan .................. 4-340446

[51] Int. Cl.[6] .................. H03M 5/02; H03M 7/00; G06F 15/31
[52] U.S. Cl. .................. 341/61; 341/123; 364/724.1
[58] Field of Search .................. 341/61, 50, 123; 364/724.1

[56] References Cited

U.S. PATENT DOCUMENTS

| | | | |
|---|---|---|---|
| 4,748,578 | 5/1988 | Lagadec et al. | 364/724 |
| 4,779,128 | 10/1988 | Johannes et al. | 358/21 R |
| 4,953,117 | 8/1990 | Lagadec | 364/724.1 |
| 5,023,825 | 6/1991 | Luthra et al. | 364/724.1 |
| 5,119,093 | 6/1992 | Vogt et al. | 341/123 |

*Primary Examiner*—Sharon D. Logan
*Attorney, Agent, or Firm*—Jordan and Hamburg

[57] ABSTRACT

A sampling rate converter includes an arithmetic circuit for performing digital filtering processing for sampling rate conversion, and a circuit for calculating a sampling rate ratio. A memory circuit stores a plurality of groups of filter coefficients which are used in the digital filtering processing performed in the arithmetic circuit, corresponding to a plurality of sampling rate ratio ranges. A select circuit selects a filter coefficient group corresponding to the sampling rate ratio. The select circuit is arranged such that even if the sampling rate ratio is outside a sampling rate ratio range corresponding to a filter coefficient group selected at the present time, the select circuit continues to select the filter coefficient group selected at this time as long as the sampling rate ratio is within a predetermined range outside the sampling rate ratio range.

6 Claims, 1 Drawing Sheet

1

SAMPLING RATE CONVERTER

FIELD OF THE INVENTION

The present invention relates to a sampling rate converter for digital audio equipment or the like.

BACKGROUND OF THE INVENTION

In digital audio equipment or the like, sampling rates are used that are different for the digital signals of different systems. Accordingly, sampling rate conversion is needed to exchange data between different systems. A device that converts a sampling rate while maintaining the identity of a waveform signal such as an audio signal is known as a sampling rate converter.

In a sampling rate converter, output data is calculated by interpolation. Optimal characteristics of an LPF used for the interpolation differ depending upon the sampling rate ratio (sampling frequency ratio) of the input digital signal sampling rate to the output digital signal sampling rate. Accordingly, it has been necessary, in order to provide a sampling rate converter capable of coping with a plurality of sampling rate ratios, to prepare a plurality of LPFs in the converter and to select an optimal LPF in accordance with the sampling rate ratio of concern.

Although it is designed to deal with a plurality of sampling rate ratios, a conventional sampling rate converter is actually adapted for conversion between only specific sampling rates and required to be capable of coping with only predetermined specific sampling rate ratios. Accordingly, it is only necessary to predetermine an optimal LPF for each sampling rate ratio.

However, a conventional sampling rate converter cannot cope with applications in which sampling rate ratios to be dealt with are not limited to specific ratios. For such applications, a novel device is needed for selecting an optimal LPF.

SUMMARY OF THE INVENTION

It is an object of the present invention to provide a sampling rate converter capable of coping with applications in which sampling rate ratios to be dealt with are not limited to specific ratios.

DESCRIPTION OF THE PREFERRED EMBODIMENTS

Figure 1:
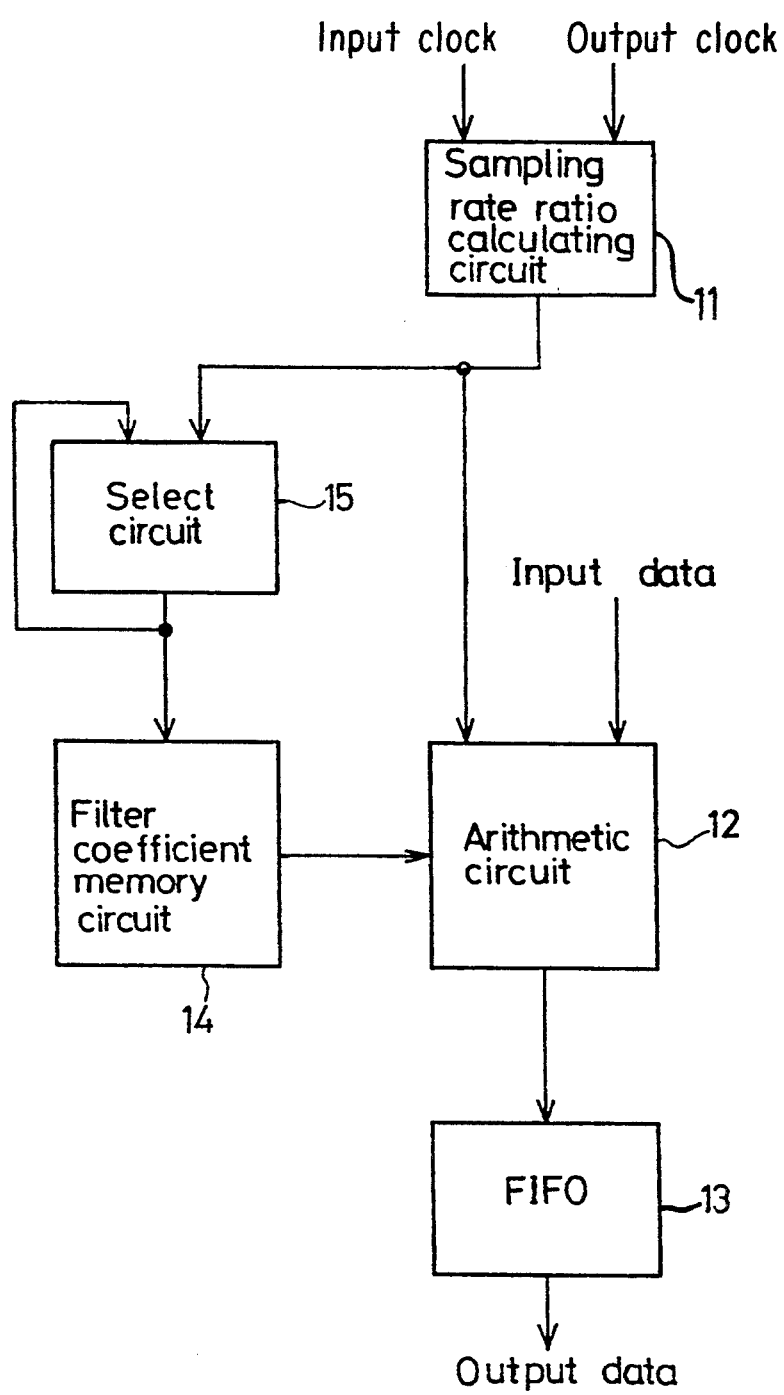
FIG. 1 is a block diagram of one embodiment of the present invention.

FIG. 1 is a block diagram of one embodiment of the sampling rate converter according to the present invention.

A sampling rate ratio calculating circuit 11 calculates a sampling rate ratio of the input digital signal sampling rate to the output digital signal sampling rate using an input signal clock corresponding to the input signal sampling rate and an output signal clock corresponding to the output signal sampling rate. An arithmetic circuit 12 performs arithmetic processing, for example, interpolation, using digital filtering or the like, to convert input data of the input signal sampling rate into output data of the output signal sampling rate. A FIFO buffer 13 sequentially outputs the output data from the arithmetic circuit 12.

A filter coefficient memory circuit 14 stores a plurality of groups of filter coefficients used in the digital filtering processing. As is well known, for a digital filtering operation, a plurality of constants to be used in the digital filtering operation are determined in correspondence to frequencies. The term "group of filter coefficients" is herein employed to mean a set of such a plurality of constants used in a single digital filtering operation. The sampling rate converter in this embodiment is especially adaptable in the presence of variation of the sampling rate ratio. Accordingly, it is necessary to select an optimal LPF in accordance with the variation of the sampling rate ratio. More specifically, it is necessary to select an optimal group of filter coefficients in accordance with the variation of the sampling rate ratio. In this embodiment, the filter coefficient memory circuit 14 is stored with a plurality of filter coefficient groups "Ci" corresponding to a plurality of ranges of sampling rate ratio "R": For example, $R \geq 1.0$ : filter coefficient group C1
$1.0 > R \geq 0.8$ : filter coefficient group C2
$0.8 > R \geq 0.6$ : filter coefficient group C3
$0.6 > R \geq 0.4$ : filter coefficient group C4
$0.4 > R$ : filter coefficient group C5

A select circuit 15 selects an optimal filter coefficient group "Ci" corresponding to a sampling rate ratio "R" calculated in the sampling rate ratio calculating circuit 11. For example, when "R=0.9" the filter coefficient group C2 is selected; when "R=0.7" the filter coefficient group C3 is selected. If the sampling rate ratio "R" is in the vicinity of the boundary of a pair of adjacent ranges, e.g., when "R" is in the vicinity of "0.6" no filter coefficient group "Ci" can be stably determined because minute variation of the sampling rate ratio "R" (e.g., minute variation of the input signal output signal clock frequency) causes the sampling rate ratio "R" to waver between the two ranges. Therefore, in this embodiment of the invention, each range of sampling rate ratio "R" is given some tolerance, and the select circuit 15 is arranged such that even if the sampling rate ratio "R" is outside the sampling rate ratio range corresponding to the filter coefficient group "Ci" selected at a given time, e.g., the present time, the select circuit 15 continues to select the filter coefficient group "Ci" selected at the given time as long as the sampling rate ratio "R" is within a predetermined range outside the sampling rate ratio range. In other words, hysteresis is imparted to the relationship between the sampling rate ratio "R" and the filter coefficient group "Ci". If an allowance of "$\Delta R = 0.01$" is given to each range of sampling rate ratio "R" for each filter coefficient group "Ci" the relationship between the sampling rate ratio "R" and the filter coefficient group "Ci" is as follows:

$R \geq 0.99$ : filter coefficient group C1
$1.01 > R \geq 0.79$ : filter coefficient group C2
$0.81 > R \geq 0.59$ : filter coefficient group C3
$0.61 > R \geq 0.39$ : filter coefficient group C4
$0.41 > R$ : filter coefficient group C5

The operation of the embodiment shown in FIG. 1 will now be explained.

The sampling rate ratio calculating circuit 11 calculates the sampling rate ratio "R" of the input signal sampling rate to the output signal sampling rate on the basis of the input signal clock and the output signal clock and applies a signal corresponding to the sampling rate ratio "R" to the select circuit 15. Assuming that the sampling rate ratio "R" is 0.7, for example, the select circuit 15 selects the filter coefficient group C3 from among those stored in the filter coefficient memory circuit 14. Once the filter coefficient group C3 is selected in this way, it is continuously selected as long as the sampling rate ratio "R" is within the range of "0.81>R≧0.59". If the sampling rate ratio "R" falls outside of the range to be "R=0.82", for example, the filter coefficient group C2 is selected. Once the filter coefficient group C2 is selected, it is continuously selected as long as the sampling rate ratio "R" is within the range of "1.01>R≧0.79". Similarly, if "R=0.58" is reached when the filter coefficient group C3 is selected, the filter coefficient group C4 is selected, and it is continuously selected as long as the sampling rate ratio "R" is within the range of "0.61>R≧0.39". By using each coefficient value in the filter coefficient group "Ci" selected in this way, the arithmetic circuit 12 performs digital filtering processing. The arithmetic circuit 12 receives input data and the signal corresponding to the sampling rate ratio "R". The results of arithmetic processing, e.g., interpolation, performed in the arithmetic circuit 12 are applied sequentially to the FIFO buffer 13 as output data. Thus, the output data from the arithmetic circuit 12 is sequentially output by the FIFO buffer 13.

Thus, by imparting hysteresis to the relationship between the sampling rate ratio "R" and the filter coefficient group "Ci", it is possible to stably select an optimal filter coefficient group "Ci" even if the sampling rate ratio "R" varies minutely.

According to the present invention, an optimal filter coefficient group can be stably selected even if the sampling rate ratio varies minutely. Accordingly, it is possible to obtain a sampling rate converter capable of coping with applications in which sampling rate ratios to be dealt with are not limited to specific ratios.

What we claim is:

1. A sampling rate converter comprising:
   an arithmetic circuit for performing digital filter processing to convert a first data signal having a first sampling rate into a second data signal having a second sampling rate;
   a circuit for calculating the sampling rate ratio of said first sampling rate and said second sampling rate;
   a memory circuit storing a plurality of groups of filter coefficients, for use in digital filter processing performed in said arithmetic circuit, corresponding to a plurality of sampling rate ratio ranges; and
   a circuit for selecting a filter coefficient group corresponding to said sampling rate ratio, said selecting circuit comprising means whereby, even if a sampling rate ratio calculated by said sampling ratio calculating circuit is outside a sampling rate ratio range corresponding to a filter coefficient group selected thereby at a given time, said selecting circuit continues to select the filter coefficient group selected at said given time as long as said sampling rate ratio is within a predetermined range of said sampling rate ratio range.

2. A sampling test converter for converting first digital signals having a first clock rate to second digital signals having a second clock rate, comprising:
   means for determining the ratio of said first and second clock rates;
   a memory having stored therein a plurality of groups of digital filter coefficients, each group of which corresponds to a different range of said ratio; and
   means responsive to said means for determining said ratio for selecting the filter coefficient group corresponding to said ratio at a given time; said responsive means comprising means for continuing to select said selected filter coefficient group as long as said ratio is within a predetermined range of the ratio range of the corresponding filter coefficient group.

3. The sampling rate converter of claim 2 further comprising an arithmetic circuit, means applying said first data signal and signals corresponding to said selected filter coefficient group to said arithmetic circuit, whereby said arithmetic circuit digitally filters said first data signal.

4. The sampling rate converter of claim 3 further comprising a FIFO coupled to receive the digitally filtered output of said first data signals from said arithmetic circuit for outputting said second digital signals.

5. The sampling rate converter of claim 2 wherein said ratio ranges overlap one another.

6. A method for converting first digital signals having a first clock rate to second digital signals having a second clock rate, comprising:
   determining the ratio of said first and second clock rates;
   storing, in a memory, a plurality of groups of digital filter coefficients, each group of which corresponds to a different range of said ratio;
   selecting the filter coefficient group corresponding to said ratio at a given time in response to said step of determining said ratio;
   continuing said selection of said selected filter coefficient group as long as said ratio is within a predetermined range of the ratio range of the corresponding filter coefficient group; and
   digitally filtering said first data signal in an arithmetic circuit, using said coefficients of selected filter coefficient group, to produce said second digital signals.

* * * * *